United States Patent [19]

Ylivakeri

[11] Patent Number: 5,073,973
[45] Date of Patent: Dec. 17, 1991

[54] METHOD AND CIRCUITRY FOR AUTOMATIC CONTROL OF THE FREQUENCY FOR A RADIO TELEPHONE

[75] Inventor: Matti Ylivakeri, Turku, Finland

[73] Assignee: Nokia-Mobira Oy, Salo, Finland

[21] Appl. No.: 376,117

[22] Filed: Jul. 6, 1989

[30] Foreign Application Priority Data

Aug. 19, 1988 [FI] Finland .................. 883855

[51] Int. Cl.⁵ ............................... H04B 1/10
[52] U.S. Cl. .......................... 455/76; 455/182; 455/314
[58] Field of Search ............... 455/75–77, 455/182, 183, 260, 264, 265, 208, 209, 192, 314; 331/1 A, 18, 25

[56] References Cited

U.S. PATENT DOCUMENTS 4,521,916  6/1985  Wine ........................... 455/182
4,703,520  10/1987  Razanski, Jr. et al. ........ 455/182
4,817,195  3/1989  Kubo et al. .................... 455/182

Primary Examiner—Curtis Kuntz
Attorney, Agent, or Firm—Darby & Darby

[57] ABSTRACT

A method and circuit for automatically controlling the frequency of a radio telephone. According to this method, the frequency of the signal detected at the receiver of a radio telephone is mixed with the output frequency of a phase-locked loop in a first mixer. The output frequency of the first mixer is mixed in a second mixer with the frequency derived from a local oscillator. The frequency of the phase-locked loop is controlled on the basis of the frequency deviation of the output frequency of the second mixer. This frequency deviation can be determined by counting the pulses generated by the second mixer during a predetermined time interval, the time interval being equal to the amount of time which elapses when a specified number of pulses generated by the local oscillator is counted. The reference frequency of the phase-locked loop is derived from the frequency of the local oscillator.

10 Claims, 2 Drawing Sheets

METHOD AND CIRCUITRY FOR AUTOMATIC CONTROL OF THE FREQUENCY FOR A RADIO TELEPHONE

BACKGROUND OF THE INVENTION

The present invention relates to a method for automatic control, on the basis of the reception frequency, of the frequency of a radio telephone. In this method the reception frequency and the output frequency of a phase-locked loop are mixed in a first mixer; the output frequency and the frequency obtained from a local oscillator are mixed in a second mixer; and the frequency of the phase-locked loop is controlled on the basis of the frequency deviation of the output frequency of the second mixer. The invention also relates to a circuit for carrying out this method.

Previously, analog methods have been used in which a control voltage proportional to the frequency is formed. This control voltage regulates the frequency of the local oscillator. There have also been implemented methods directed to the object of the present invention which operate according to the counter principle. In these methods, a fixed reference oscillator is used, for example, a crystal oscillator of a processor as disclosed in patent application FI 864 909.

The disadvantages of the analog methods include the temperature creep appearing in them, deterioration of the circuits as they age, and the need for calibration, i.e. tuning of the circuitry, at the manufacturing stage. In known apparatus using a fixed reference oscillator and operating according to the counter principle, at least two separate oscillators are needed; one of which, the reference oscillator, must be very precise and stable. This is costly and requires complicated circuitry.

SUMMARY OF THE INVENTION

The object of the present invention is to eliminate these disadvantages and to provide an automatic frequency control (AFC) which functions according to the counter principle. A further object of this invention is to provide a circuit which does not require a precise and stable reference oscillator but in which the frequency of the one and only oscillator is controlled. To achieve this, the method according to the invention is characterized in that the local oscillator has a controllable frequency which is controlled on the basis of the frequency deviation of the output frequency of a mixer, the reference frequency of the phase-locked loop being derived from the frequency of the local oscillator.

Owing to the invention, a stable, high-precision reference oscillator is not needed; the basic frequency of the entire telephone can be locked to the frequency of the signal detected at the receiver of a radio telephone, the reception frequency. Such a digital AFC circuit, operating according to the counter principle, is less sensitive to the aging phenomena than is the traditional analog circuitry which operate based on voltage levels. In addition, this type of circuit does not require manual calibration at the manufacturing stage.

According to a preferred embodiment of the invention, the frequency deviation of one of two mixers is determined by counting the pulses it produces within a certain time interval. The selected time interval is determined by counting a specified number of pulses generated by the local oscillator. When the counting result corresponding to the specified time interval is known, the control voltage of the crystal oscillator is adjusted in the correct direction by a programmable control circuit. The magnitude of this adjustment is determined by a calculation result obtained on the basis of some algorithm or measuring results. In this manner, the reference frequency changes and the measuring procedure is repeated until the desired frequency precision has been obtained.

BRIEF DESCRIPTION OF THE DRAWINGS

The invention and its other characteristics and advantages are described below in greater detail in the form of an example and with reference to the accompanying drawings, in which.

DETAILED DESCRIPTION

Figure 1:
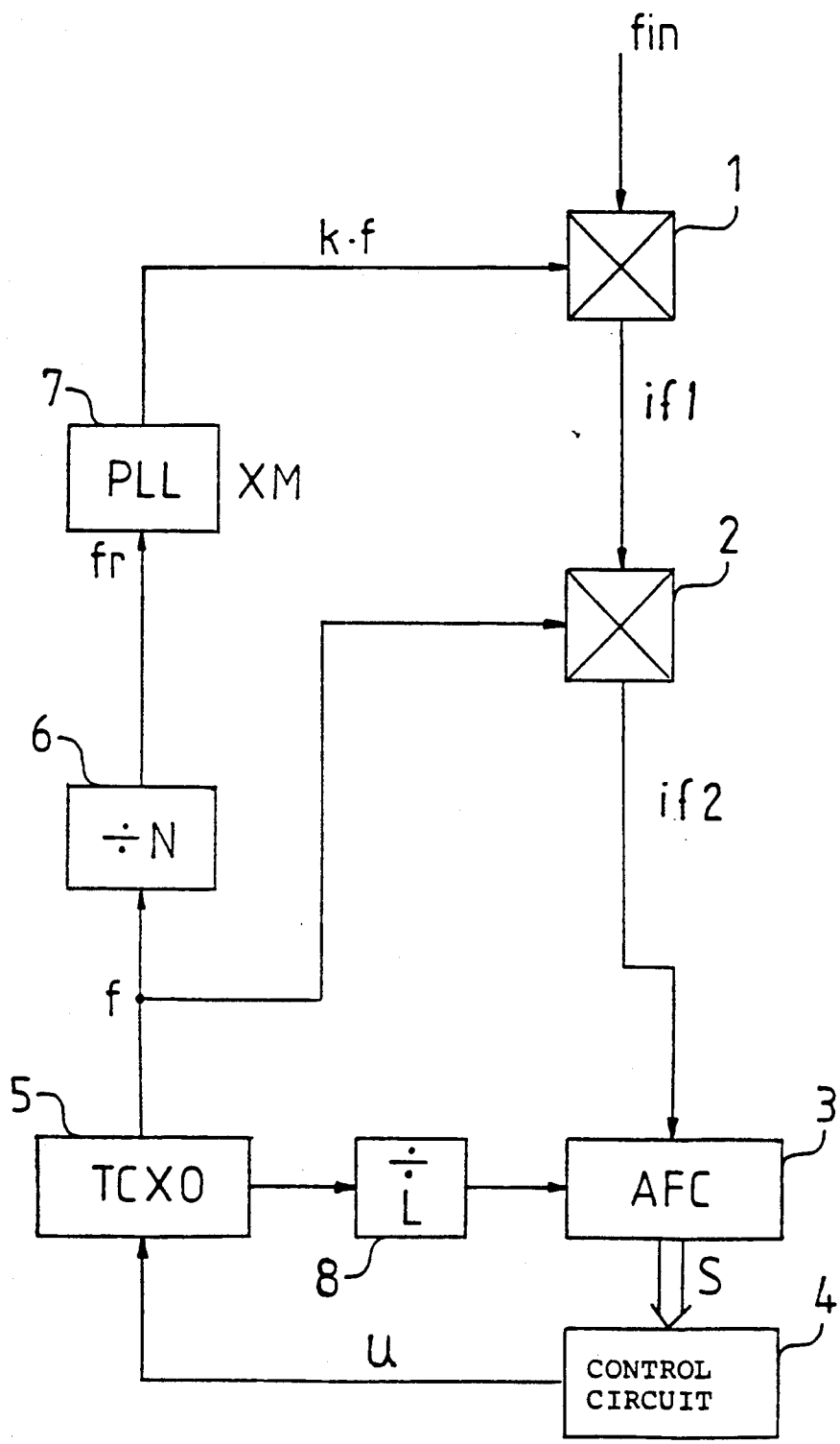
FIG. 1 illustrates diagrammatically a circuit according to the invention.

In FIG. 1, reference numerals 1 and 2 indicate two mixers. Numeral 3 indicates the actual automatic frequency control (AFC) circuit which forms the calculation result for the control circuit 4. The AFC circuit controls a crystal oscillator 5 having a controllable frequency. From the crystal oscillator 5 the frequency f to be controlled is fed, on the one hand, to the mixer 2 and, on the other hand, to a dividing means 6 (dividing number N) as a reference frequency fr for a phase-locked loop 7. The output frequency $k \times f$ of the phase-locked loop is applied to the mixer 1 in order to be mixed with the incoming reception signal fin.

The frequency obtained from the crystal oscillator 5 is further applied via a divider means 8 (dividing number L) to the AFC circuit 3 for the calculation of the predetermined time interval, as explained below.

Figure 2:
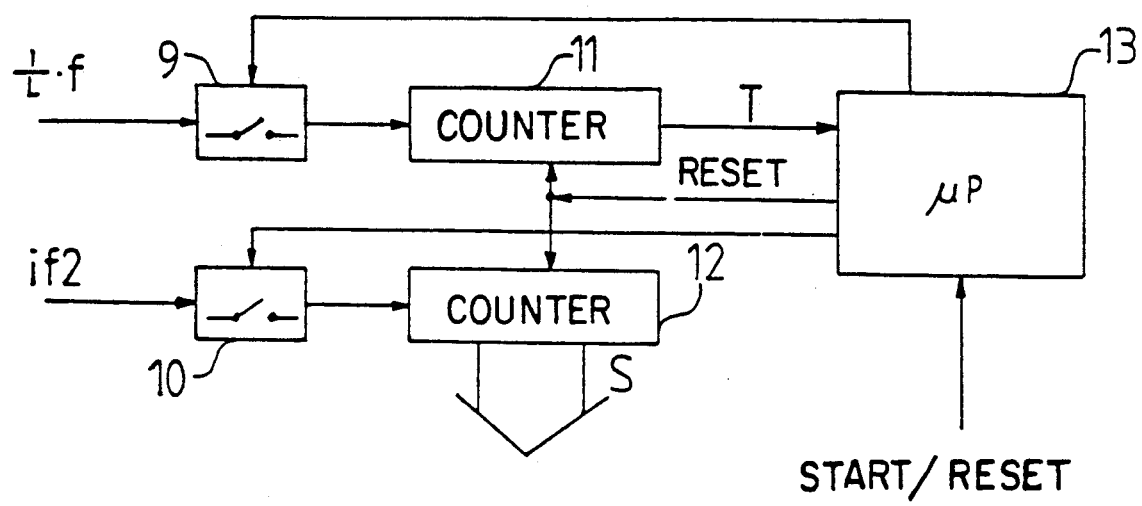
FIG. 2 illustrates in greater detail the automatic frequency control block 3 of FIG. 1.

The operation of the circuitry is described below with reference to both FIG. 1 and FIG. 2.

A predetermined number of pulses of the crystal oscillator 5 are counted by means of a counter 11 belonging to the AFC circuit, and thereby a certain time interval, or time constant, T is determined. The number of pulses of the second intermediate frequency if2 included in the time interval T is counted by means of a counter 12, and according to a certain algorithm a calculation result S is determined, which is applied to the control circuit 4. The control circuit 4 forms, on the basis of the calculation result, a control voltage U for the crystal oscillator 5.

The input frequencies $1/L \times f$ and if2 of the counters 11 and 12 are coupled to the counters via switches 9 and 10, which are controlled by a microprocessor 13. The microprocessor also controls the zeroing of the counters 11 and 12.

The operation of the circuit is based on the fact that the frequency deviation of the crystal oscillator 5 is seen directly in the counter 11 (regardless of the divider means 8 preceding the counter). However, if the injection frequency $k \times f$ is greater than the frequency of the oscillator 5, the deviation in the intermediate-frequency signal is multiplied. In the case presented, the injection frequency is $k \times f = M/N \times f$.

In the mixer 1 the absolute value of the deviation remains constant. Thus, the absolute value of the frequency deviation of the first intermediate-frequency signal if1 is equal to the deviation of the injection frequency $k \times f$.

In the second mixer 2, the total deviation either increases or decreases, depending on the injection method used in the mixers (injection from above or from below) and on whether the frequency of the oscillator 5 has been divided or multiplied for the second mixing. In the case presented, the frequency of the crystal oscillator 5 is applied directly to the second mixer 2.

In addition to what has been presented above, the relative proportion of the deviation in the intermediate-frequency if2 is considerably greater than that in the injection frequency, because the intermediate frequency is much lower than the injection frequency (order of magnitude 2,000–5,000).

In the embodiments of the figures, the deviation of the oscillator is seen approximately 20-fold in the intermediate frequency if2. Thus, the effect of the frequency deviation of the oscillator 5 on the time constant T is infinitesimal, and the control loop converges greatly on successive counting and control rounds.

In the circuitry presented, the reference oscillator 5 does not require separate manual control because of possible frequency changes due to aging; the correction can be carried out by changing the basic value of the control voltage U of the crystal oscillator, if the AFC correction is repeatedly in the same direction, for example 100 times in succession.

An additional advantage of the circuitry presented is its ease of integration into a system such as a radio telephone. In addition, it is possible to use only one crystal oscillator to provide the basic frequency to all the components. The usability of the circuitry, of course, depends on the implementation of the radio's components and on the frequencies used in it.

The counting result of the intermediate-frequency counter can be transferred to the processor in either a serial or a parallel form. It is, of course, possible to add to the circuitry, as options, various counting periods which are program-selected.

I claim:

1. A method for controlling the frequency of a radio telephone having an input for a received signal, comprising:
    generating a local oscillator frequency with a signal controlled local oscillator;
    coupling the local oscillator frequency as the input signal to a phase-locked loop;
    mixing the frequency of the received signal with the phase-locked loop output frequency in a first mixer whereby a first mixer output frequency is created;
    mixing the first mixer output frequency with the local oscillator frequency in a second mixer whereby a second mixer frequency is created;
    calculating a base time interval required to count a specified number of pulses generated by the local oscillator;
    counting the number of pulses generated by the second mixer during the base time interval so that a second mixer frequency deviation is calculated; and
    controlling the local oscillator frequency based upon the second mixer frequency deviation.

2. A method according to claim 1 wherein the phase-locked loop reference frequency is formed by dividing the local oscillator frequency by an integer.

3. A circuit for controlling the frequency of a radio telephone having an input for a received signal comprising:
    a signal controlled oscillator for generating a reference frequency, said signal controlled oscillator having a control input for receiving a signal to control said reference frequency;
    a phase-locked loop having an input coupled to said signal controlled oscillator producing a phase-locked loop output frequency;
    first mixer means responsive to said received signal and the phase-locked loop output frequency, the first mixer means producing a first mixer output frequency;
    a second mixer means responsive to the first mixer output signal and the reference frequency for producing a second mixer output signal;
    control means responsive the signal controlled oscillator and the second mixer output frequency for producing a control signal output, the control signal output being connected to the signal controlled oscillator control input.

4. A circuit according to claim 3 wherein the control means comprises a counter means which counts the pulses generated by the second mixer means.

5. A circuit according to claim 3 wherein the control signal producer means further comprises a second counter means connected to the local oscillator.

6. A circuit according to claim 3 further comprising a divider means being connected between the local oscillator and the second counter means.

7. A circuit according to claim 3 further comprising a divider means connected between the local oscillator and phase-locked loop.

8. A circuit according to claim 3 wherein the local oscillator output frequency is applied directly to the input of the second mixer.

9. A circuit according to claim 3 wherein the local oscillator output frequency is applied to a divider means, the divider means being connected to the input of the second mixer.

10. A circuit according to claim 3 wherein the local oscillator output frequency is applied to a multiplier means, the multiplier means being connected to the input of the second mixer.

* * * * *